United States Patent
Xianyu et al.

(10) Patent No.: US 7,999,266 B2
(45) Date of Patent: Aug. 16, 2011

(54) SEMICONDUCTOR DEVICE INCLUDING POLY-SI AND METHOD OF MANUFACTURING THE SAME

(75) Inventors: Wenxu Xianyu, Suwon-si (KR); Jung-hyun Lee, Yongin-si (KR); Hyung-jin Bae, Seoul (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 652 days.

(21) Appl. No.: 12/000,242

(22) Filed: Dec. 11, 2007

(65) Prior Publication Data
US 2008/0164479 A1    Jul. 10, 2008

(30) Foreign Application Priority Data
Jan. 5, 2007   (KR) .......................... 10-2007-0001704

(51) Int. Cl.
*H01L 29/43*    (2006.01)
*H01L 21/283*   (2006.01)

(52) U.S. Cl. ............ 257/73; 257/46; 257/104; 257/761; 257/E29.146; 257/E29.327; 257/E21.162; 257/E21.163; 438/685; 438/571

(58) Field of Classification Search .................... 257/46, 257/73, 104, 485, 755, 761, E29.146, E29.148, 257/E29.327, E29.328, E29.338, E21.162, 257/E21.163; 438/571, 582, 583, 685
See application file for complete search history.

(56) References Cited

U.S. PATENT DOCUMENTS

| | | | |
|---|---|---|---|
| 6,646,352 B2* | 11/2003 | Ohmi et al. .................. 257/763 |
| 6,927,430 B2* | 8/2005 | Hsu ................................ 257/235 |
| 2004/0232509 A1* | 11/2004 | Vyvoda ........................ 257/473 |

* cited by examiner

*Primary Examiner* — Jerome Jackson, Jr.
*Assistant Examiner* — Yu Chen
(74) *Attorney, Agent, or Firm* — Harness, Dickey & Pierce, P.L.C.

(57) ABSTRACT

A semiconductor device including polysilicon (poly-Si) and method of manufacturing the same are provided. The semiconductor device includes a $TaN_x$ material layer and a poly-Si layer formed on the $TaN_x$ material layer. The semiconductor device including poly-Si may be manufactured by forming a $TaN_x$ material layer and forming a poly-Si layer by depositing silicon formed on the $TaN_x$ material layer and annealing silicon.

13 Claims, 5 Drawing Sheets

US 7,999,266 B2

SEMICONDUCTOR DEVICE INCLUDING POLY-SI AND METHOD OF MANUFACTURING THE SAME

PRIORITY STATEMENT

This application claims the benefit of priority under 35 U.S.C. §119 from Korean Patent Application No. 10-2007-0001704, filed on Jan. 5, 2007, in the Korean Intellectual Property Office, the content of which is incorporated by reference herein in its entirety.

BACKGROUND

1. Field

Example embodiments relate to a semiconductor device including polysilicon (poly-Si). Other example embodiments relate to a semiconductor device which includes a conductive material layer that induces more stable growth of poly-Si and/or reduces diffusion into poly-Si when poly-Si used in forming a semiconductor device and a method of manufacturing the same.

2. Description of the Related Art

Polysilicon (poly-Si) is a material that is widely used in the art to form a semiconductor device (e.g., a diode or a thin film transistor (TFT)). Poly-Si may be deposited at a low temperature and may be doped at a substantially high concentration. Cross-point type memory devices having a diode (1 D)-resistor (1 R) structure are acknowledged in the art. Poly-Si may be used for a silicon diode (e.g., a p-n type or schottky barrier diode).

FIG. 1 is a diagram illustrating a perspective view of a conventional p-n junction diode.

Referring to FIG. 1, a p-type poly silicon (Si) layer 12 and an n-type poly-Si layer 13 may be formed on a lower electrode 11. The p-type poly-Si layer 12 and the n-type poly-Si layer 13 may form a diode structure. An upper electrode 14 may be formed on the p-type poly-Si layer 12 and the n-type poly-Si layer 13. In a cross-point type memory device, for example, of a resistive random access memory (RRAM), the lower electrode 11 and the upper electrode 14 cross each other and a storage node formed may be formed between the diode structure and the upper electrode 14. The storage node may be formed of a transition metal oxide.

It may be desirable to form electrodes, which have increased adhesion characteristics with respect to silicon, below poly-Si. The crystallinity of poly-Si grown on the electrodes may be high. A material that deters diffusion from the electrodes into poly-Si may be desirable.

In the conventional art, tungsten (W), tantalum (Ta) and/or titanium (Ti) are used to form electrodes below poly-Si. The conventional art acknowledges a method of preventing metal diffusion by forming a barrier layer (e.g., TiN or the like) between a lower electrode and poly-Si. Because the above-mentioned metals do not exhibit the desired adhesion characteristics with respect to silicon, it may be difficult to form higher-quality poly-Si during excimer laser annealing (ELA). A substantial amount of diffusion may occur from the metal into poly-Si during an ELA or any subsequent annealing process(es), making it difficult to form a p-n diode.

FIG. 2A is a graph illustrating the results of secondary ion mass spectroscopy (SIMS) of a conventional poly-Si/Ti/Mo/SiO$_2$ sample that is crystallized by ELA at a low temperature.

In FIG. 2A, molybdenum (Mo) and titanium (Ti) were used to form a metallic layer on a SiO$_2$ insulating thin film. A low temperature annealing process was performed on a sample in order to apply silicon on the metallic layer, forming poly-Si. The composition value per ingredient was determined based on the depth of the sample.

Referring to FIG. 2A, Ti and Mo were observed in a short sputtering time. As such, the materials used to form the Ti and Mo layers below a poly-Si layer diffuse and penetrate into poly-Si during the ELA process.

FIG. 2B shows a transmission electron microscope (TEM) image taken long a cross-section of a conventional poly-Si/Ti/Mo/SiO$_2$ sample crystallized by ELA.

Referring to FIG. 2B, a region representing the formation of silicide (e.g., Si—Ti or Si—Mo) from the reaction of Si and Ti (and Mo when the Si is changed into a liquefied state during an ELA process) is present. Silicide reduces (or lowers) the melting point of the metal. As such, the metal diffuses into the silicon layer. According to example embodiments, the metal may diffuse into the surface of poly-Si through a grain boundary of poly-Si. As such, the device may not exhibit the desired characteristics.

FIG. 3A is a microscopic photo showing the surface of a conventional amorphous-Si/Ti/Mo/Ti/SiO$_2$ (a-Si/Ti/Mo/Ti/SiO$_2$) sample after annealing. The a-Si/Ti/Mo/Ti/SiO$_2$ sample in FIG. 3A was annealed for about 5 minutes in an N$_2$ atmosphere of about 500° C.

FIG. 3B is a microscopic photo showing the surface of a conventional a-Si/Ti/W/Ti/SiO$_2$ sample after annealing. The a-Si/Ti/W/Ti/SiO$_2$ sample in FIG. 3B was annealed for about 5 minutes in an N$_2$ atmosphere of about 500° C.

Referring to FIGS. 3A and 3B, if the a-Si/Ti/Mo/Ti/SiO$_2$ sample and the a-Si/Ti/W/Ti/SiO$_2$ sample are annealed in an N$_2$ atmosphere of about 500° C., a-Si forms silicide due to an increased reaction property with a lower metallic layer. As such, the surface of the thin film becomes rough.

SUMMARY

Example embodiments relate to a semiconductor device including polysilicon (poly-Si). Other example embodiments relate to a semiconductor device which includes a conductive material layer that induces more stable growth of poly-Si and/or reduces diffusion into poly-Si when poly-Si used in forming a semiconductor device and a method of manufacturing the same.

Example embodiments provide a semiconductor device including polysilicon (poly-Si) wherein the semiconductor device exhibits increased adhesion properties with silicon during a process of forming poly-Si.

According to example embodiments, it is easier to grow poly-Si and diffusion into silicon is reduced. As such, the poly-Si functions as a diffusion preventing layer.

According to example embodiments, there is provided a semiconductor device including poly-Si (polysilicon), the semiconductor device including a TaN$_x$ material layer and a poly-Si layer formed on the TaN$_x$ material layer wherein x may be between 0.5 and 1.5 (i.e., $0.5 \leq x \leq 1.5$).

The poly-Si layer may be a p-type poly-Si layer. The semiconductor device may include an n-type poly-Si layer formed on the p-type poly-Si layer.

According to example embodiments, there is provided a method of manufacturing a semiconductor device including poly-Si (polysilicon), the method including forming a TaN$_x$ material layer and forming a poly-Si layer by depositing silicon formed on the TaN$_x$ material layer and annealing silicon.

The TaN$_x$ material layer may be formed using sputtering, atomic layer deposition (ALD) or ion beam deposition (IBD). The TaN$_x$ material layer may be formed at a temperature of 200° C. to 600° C.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 1 is a diagram illustrating a perspective view of a conventional p-n junction diode;

FIG. 4 is a diagram illustrating a diode structure including poly-Si according to example embodiments;

FIG. 7 is a graph showing an X-ray diffraction (XRD) after TaN$_x$ is formed according to example embodiments.

DETAILED DESCRIPTION OF EXAMPLE EMBODIMENTS

Figure 1:
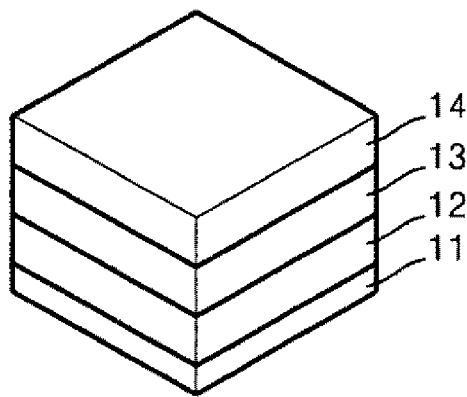

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device including polysilicon (poly-Si). Other example embodiments relate to a semiconductor device which includes a conductive material layer that induces more stable growth of poly-Si and/or reduces diffusion into poly-Si when poly-Si used in forming a semiconductor device and a method of manufacturing the same.

Figure 4:
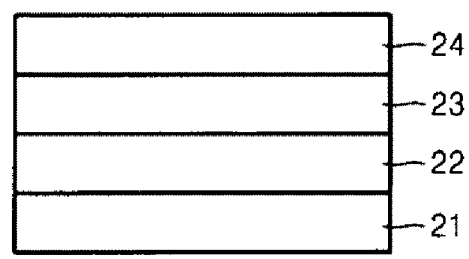

FIG. 4 is a diagram illustrating a diode structure including polysilicon (poly-Si) according to example embodiments.

Referring to FIG. 4, a p-type poly-Si layer 22 and an n-type poly-Si layer 23 may be formed on a lower electrode 21. The p-type poly-Si layer 22 and the n-type poly-Si layer 23 may each be a diode structure. The lower electrode 21 may be formed of $TaN_x$. An upper structure 24 may be formed on the diode structures 22 and 23.

If the diode structure 22 and 23 are simple diode structures, the upper structure 24 may be an upper electrode. If the diode structures 22 and 23 are cross-point type memory devices (e.g., a resistive random access memory (RRAM) device), the upper structure 24 may have a resistive layer. The resistive layer may be a storage node formed of a transition metal oxide. The transition metal oxide may be at least one selected from the group consisting of NiO, CoO, $Nb_2O_5$, TiO, $Fe_2O_5$, CuO and combinations thereof. The upper electrode may cross the lower electrode 21.

If the diode structures 22 and 23 are schottky barrier diodes, an n-type poly-Si layer may be formed on the lower electrode 21. Silicide, which forms a schottky barrier, may be formed on the n-type poly-Si layer.

$TaN_x$ for poly-Si growth according to example embodiments may be used in a poly-Si p-n junction diode, a schottky barrier diode and a cross point type memory device. However, the example embodiments are not limited thereto, for example, example embodiments may be applied to a semiconductor device having a conductive layer structure formed below the poly-Si layer.

The characteristics of a semiconductor device including poly-Si formed on $TaN_x$ will now be described in detail.

A $TaN_x$ material layer may be formed. Silicon may be applied to the $TaN_x$ material layer. Silicon, which has not been subjected to annealing, may be present in an amorphous state. In order to form amorphous silicon (a-Si) as poly-Si, an annealing process may be performed. The annealing process may be performed by an excimer laser annealing (ELA) process.

Figure 5A:
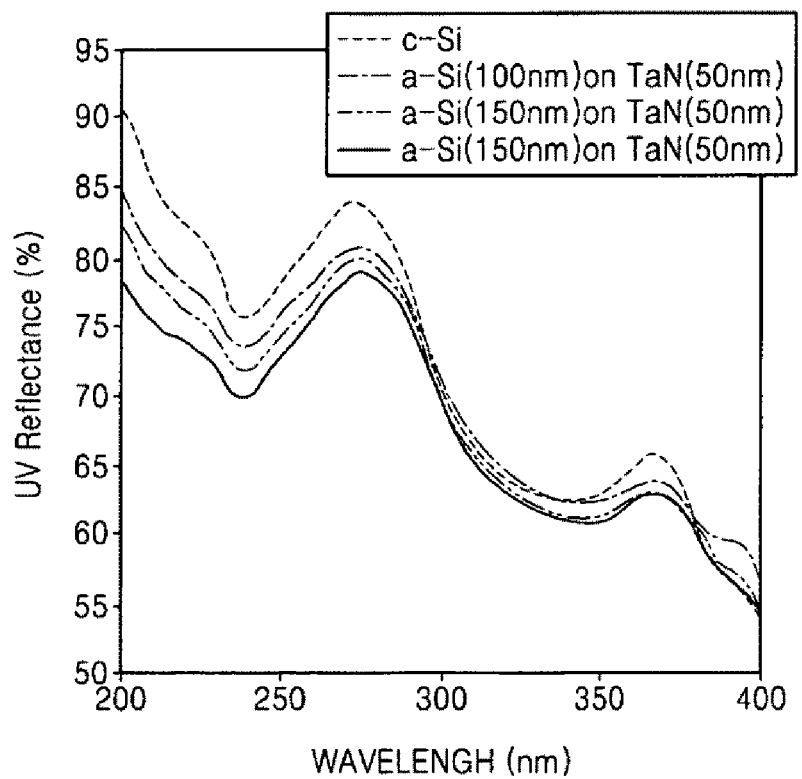
FIG. 5A is a graph showing wavelength-UV reflectance of a TaN$_x$ electrode with a-Si formed thereon according to example embodiments.

FIG. 5A is a graph showing wavelength-UV reflectance after a-Si formed on a $TaN_x$ electrode having about 50 nm is crystallized using ELA according to example embodiments.

Referring to FIG. 5A, the UV reflectance between a wavelength of 250 nm and 300 nm, the UV reflectance of a-Si, which is crystallized, has a similar pattern to that the UV reflectance of c-Si. As such, poly-Si is formed as desired. In an amorphous silicon state, the UV reflectance decreases at a wavelength of 250 nm -300 nm.

Figure 5B:
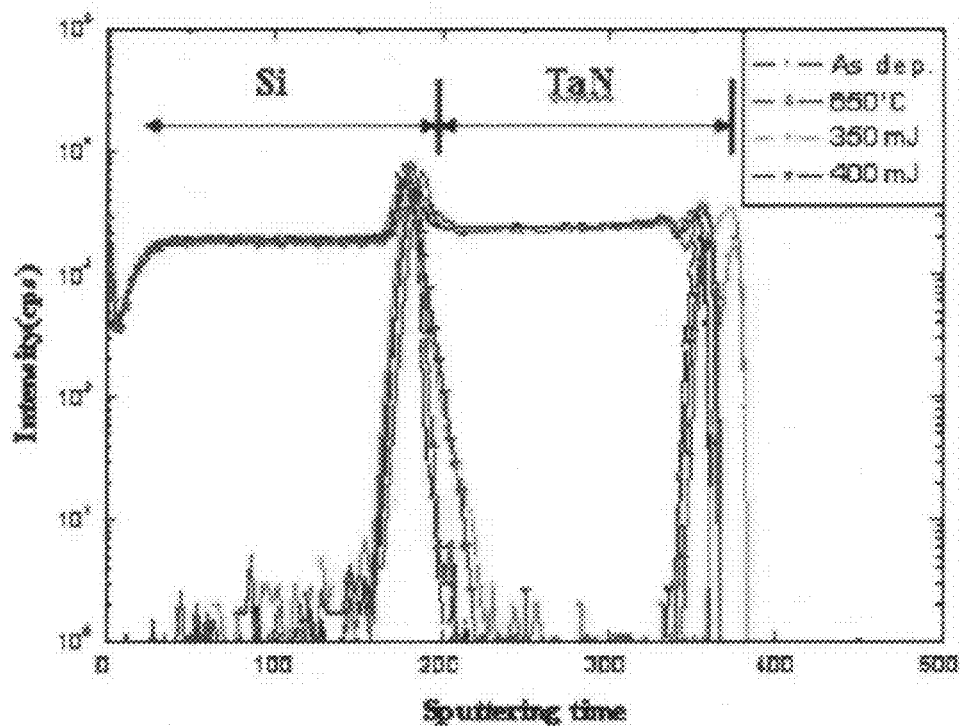
FIG. 5B is a graph showing the results of SIMS on a poly-Si/TaN/SiO$_2$ sample crystallized using ELA at a low temperature according to example embodiments.

FIG. 5B is a graph showing the results of SIMS on a poly-Si/TaN/$SiO_2$ sample crystallized using ELA at a low temperature.

Figure 2A:
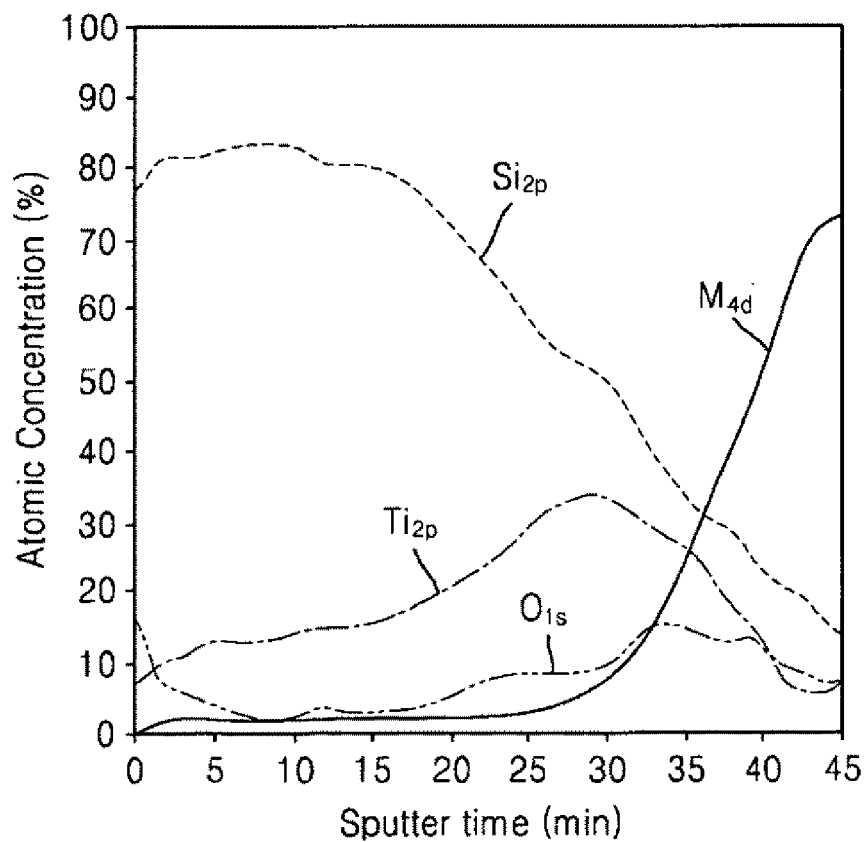
FIG. 2A is a graph illustrating the results of secondary ion mass spectroscopy (SIMS) of a conventional poly-Si/Ti/Mo/SiO$_2$ sample that is crystallized by excimer laser annealing (ELA) at a low temperature.
Figure 2B:
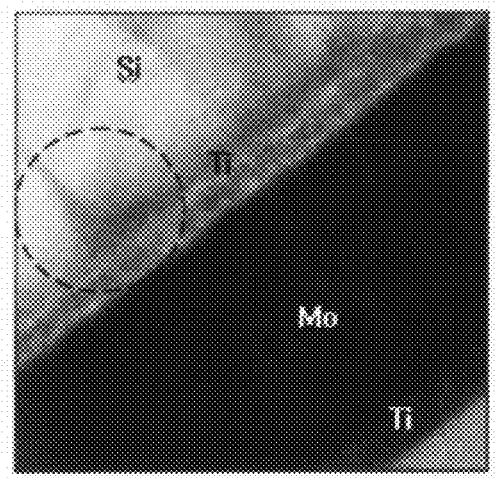
FIG. 2B shows a transmission electron microscope (TEM) image taken along a cross-section of a conventional poly-Si/Ti/Mo/SiO$_2$ sample crystallized by ELA.
Figure 3A:
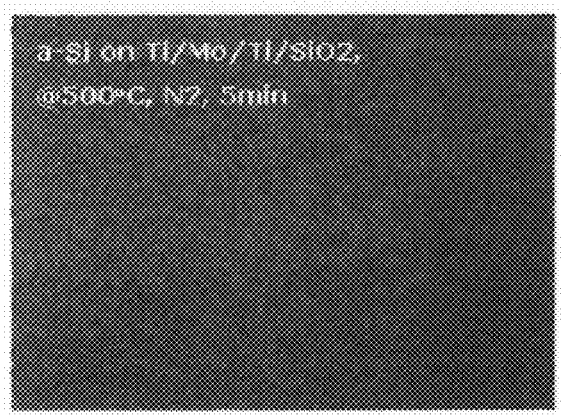
FIG. 3A is a microscopic photo showing the surface of a conventional a-Si/Ti/Mo/Ti/SiO$_2$ sample after annealing.
Figure 3B:
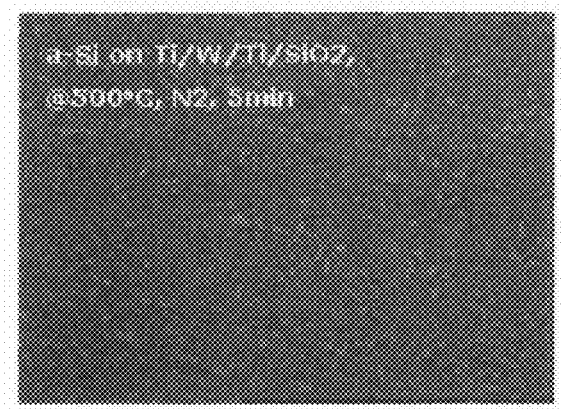
FIG. 3B is a microscopic photo showing the surface of a conventional a-Si/Ti/W/Ti/SiO$_2$ sample after annealing.

In a comparison of FIGS. 2B and 5B, there is a significant difference between the SIMS results of poly-Si sample according to example embodiments shown in FIG. 5B and the SIMS results of the conventional poly-Si/Ti/Mo/$SiO_2$ sample shown in FIG. 2B.

Referring to FIG. 5B, the sputtering time corresponding to the formation of poly-Si and the sputtering time corresponding to the formation of $TaN_x$ are clearly delineated. Poly-Si remains in a region up to a desired depth. $TaN_x$ is present in a concentrated region less than a desired depth. TaSiN, which is a reaction resultant material between $TaN_x$ and silicon, is formed between poly-Si and $TaN_x$, preventing (or reducing) diffusion of a dopant.

Referring to FIG. 2B, materials used to form the metallic layer under poly-Si diffused into the poly-Si. The materials were present in, or about, a surface of the poly-Si. If $TaN_x$ is used as a lower electrode, then diffusion of $TaN_x$ and oxygen in $SiO_2$ (formed under $TaN_x$) into the poly-Si layer may be prevented (or reduced). If $TaN_x$ is used as a lower electrode, $TaN_x$ may simultaneously function as a metal electrode and a diffusion preventing layer.

Figure 6A:
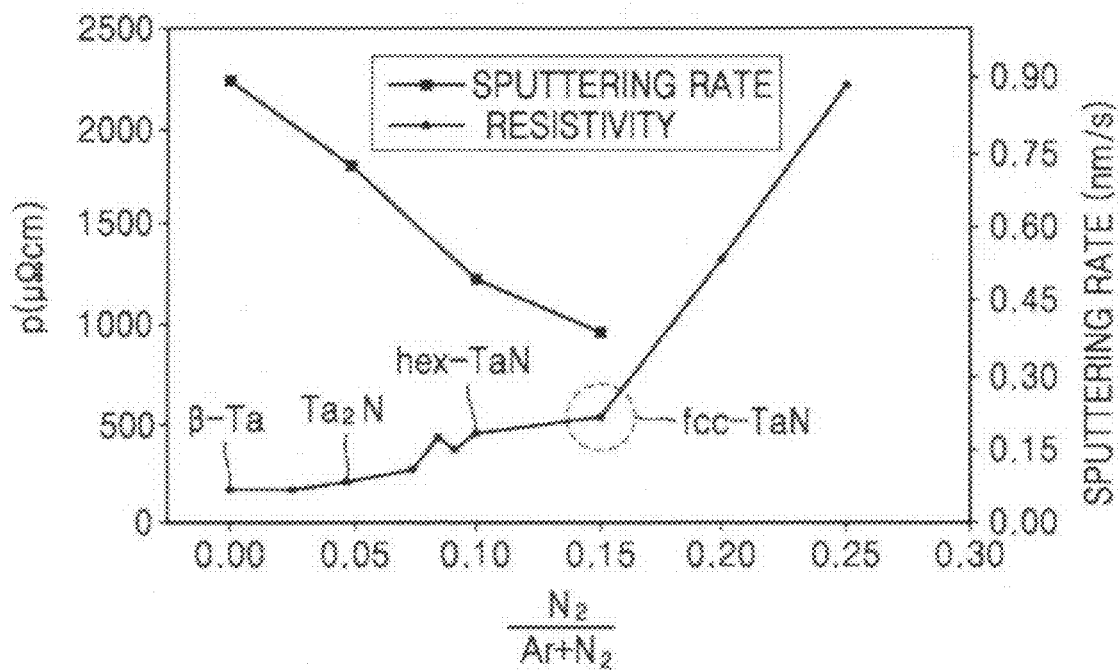
FIGS. 6A and 6B are graphs showing the ratio of N$_2$ and resistivity during the formation of TaN$_x$ according to example embodiments.
Figure 6B:
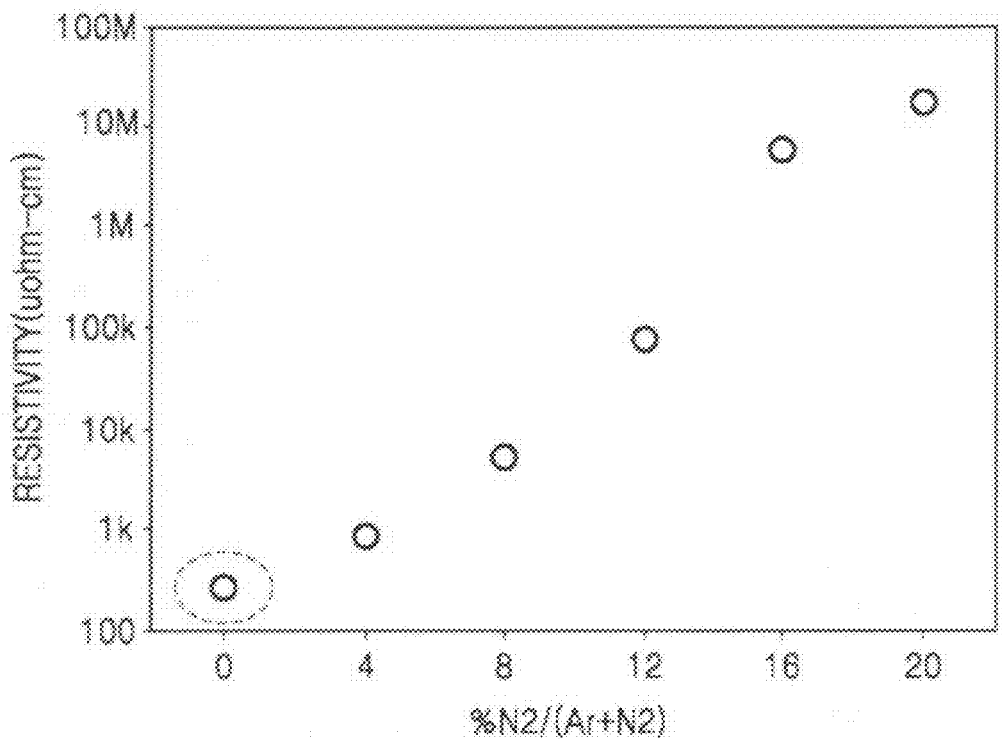

FIGS. 6A and 6B are graphs showing the partial pressure of nitrogen ($N_2$) and conductivity if a $TaN_x$ electrode is formed using a sputtering process according to example embodiments.

If $TaN_x$ is used as a target in a sputtering process and is deposited on a substrate, the composition of $TaN_x$ on the substrate may be adjusted using argon (Ar) and/or $N_2$ as an atmospheric gas and a resistance value may be measured.

Referring to FIGS. 6A and 6B, if the partial pressure of $N_2$ is low, then a resistance value is low. If the partial pressure of $N_2$ is substantially low, then $N_2$ exhibits metal characteristic(s). If the partial pressure of $N_2$ is increased, then $N_2$ exhibits semiconductor characteristic(s). In the $TaN_x$ according to example embodiments, the composition ratio of Ta and N (i.e., Ta:N) may be 1:0.5 to 1:1.5. "X" in $TaN_x$ may be 0.5 to 1.5. If $TaN_x$ is formed using sputtering, atomic layer deposition (ALD) or ion beam deposition (IBD), the partial pressure of $N_2$ may be adjusted to 5 % to 25 % at a temperature of 200° C. to 600° C.

Figure 7:
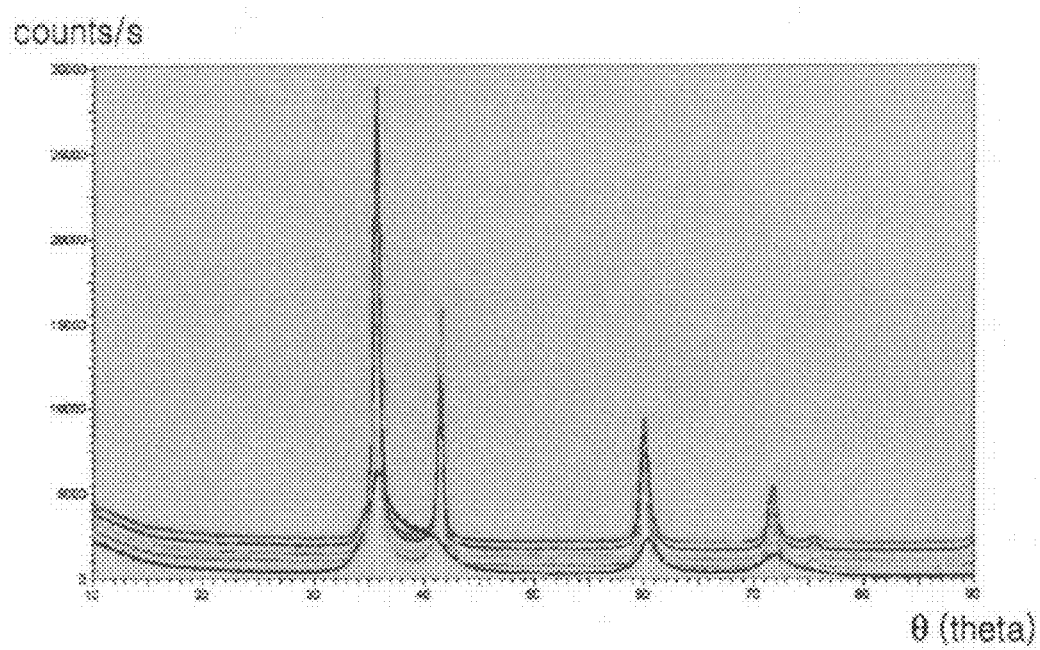

FIG. 7 is a graph showing X-ray diffraction (XRD) of $TaN_x$ formed using a sputtering process at a temperature of 200 ° C. to 600 ° C.

Referring to FIG. 7, peaks are observed at 35.861 θ, 41.641 θ, and 60.312 θ. As such, $TaN_x$ has a cubic structure.

According to example embodiments, diffusion of material (s) used to form a metallic electrode may be prevented (or reduced) through a grain boundary of poly-Si during a conventional annealing process of forming poly-Si on a metal electrode.

According to other example embodiments, $TaN_x$ has desirable adhesion properties with poly-Si such that the poly-Si may be easily grown.

According to yet other example embodiments, $TaN_x$ may simultaneously function as an electrode and a diffusion preventing layer for preventing (or reducing) diffusion of a dopant into a poly-Si layer.

According to example embodiments, a poly-Si diode having increased properties may be provided. Example embodiments may be applied to a semiconductor device having a $TaN_x$/poly-Si structure, as well as, a diode.

If $TaN_x$ for poly-Si growth according to example embodiments is used as a lower electrode of a p-n junction diode and if poly-Si, as well as, a cross point type memory device are formed on an electrode layer, then $TaN_x$ may be used as an electrode layer.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A diode including polysilicon (poly-Si), comprising:
   a $TaN_x$ material layer; and
   a poly-Si layer on the $TaN_x$ material layer,
   wherein TaSiN is between the $TaN_x$ material layer and the poly-Si layer,
   the $TaN_x$ material layer has a lattice structure, and
   the lattice structure is cubic.

2. The diode of claim 1, wherein x is between 0.5 and 1.5.

3. The diode of claim 1, wherein the poly-Si layer is a p-type poly-Si layer.

4. The diode of claim 3, further comprising an n-type poly-Si layer formed on the p-type poly-Si layer.

5. The diode of claim 1, wherein the poly-Si layer is an n-type poly-Si layer, and
   silicide is formed on the n-type poly-Si layer, wherein the silicide forms a schottky barrier.

6. A method of manufacturing a diode including polysilicon (poly-Si), the method comprising:
   forming a $TaN_x$ material layer; and
   forming a poly-Si layer by depositing silicon formed on the $TaN_x$ material layer and annealing silicon,
   wherein TaSiN is formed between the $TaN_x$ material layer and the poly-Si layer,
   forming the $TaN_x$ material layer includes forming a lattice structure, and
   the lattice structure is cubic.

7. The method of claim 6, wherein x is between 0.5 and 1.5.

8. The method of claim 6, wherein the $TaN_x$ material layer is formed using at least one technique selected from the group consisting of sputtering, atomic layer deposition (ALD) and ion beam deposition (IBD).

9. The method of claim 6, wherein the $TaN_x$ material layer is formed at a temperature of 200° C. to 600° C.

10. The method of claim 6, wherein forming the poly-Si layer includes forming a p-type poly-Si layer.

11. The method of claim 10, further comprising forming an n-type poly-Si layer on the p-type poly-Si layer.

12. The method of claim 6, wherein forming the poly-Si layer includes forming an n-type poly-Si layer.

13. The method of claim 12, further comprising depositing silicide on the n-type poly-Si layer, wherein the silicide forms a schottky barrier.

* * * * *